United States Patent [19]
> Wong et al.

[11] 4,122,536
[45] Oct. 24, 1978

[54] SELF-ORGANIZING MAGNETIC BUBBLE LATTICE FILE

[75] Inventors: Chak-Kuen Wong, Briarcliff Manor; Po Cheung Yue, New York, both of N.Y.

[73] Assignee: International Business Machines Corporation, Armonk, N.Y.

[21] Appl. No.: 739,233

[22] Filed: Nov. 5, 1976

[51] Int. Cl.² ............................................. G11C 19/08
[52] U.S. Cl. ......................................... 365/3; 365/34; 365/35
[58] Field of Search ....................... 340/174TF; 365/3

[56] References Cited

U.S. PATENT DOCUMENTS

| | | | |
|---|---|---|---|
| 3,930,244 | 12/1975 | Voegeli | 340/174 TF |
| 4,040,018 | 8/1977 | Chang et al. | 340/174 TF |
| 4,040,038 | 8/1977 | Rosier | 365/3 |
| 4,052,709 | 10/1977 | Chaudhari et al. | 365/3 |
| 4,052,710 | 10/1977 | Calhoun et al. | 365/3 |

OTHER PUBLICATIONS

IBM Technical Disclosure Bulletin – vol. 17, No. 8, Jan. 1975, pp. 2490–2492.

Primary Examiner—James W. Moffitt
Attorney, Agent, or Firm—Jackson E. Stanland

[57] ABSTRACT

A structure and technique are provided for improving the average access time in a bubble lattice file (BLF) storage, and for providing reordering capability in the lattice file. The bubble lattice arrangement includes a translation structure for moving bubble domains in the lattice to various access channels where columns of bubble domains can be removed from the lattice. These are double access channels which remove two adjacent columns of bubble domains at the same time. A read means and a write means are associated with each channel of the double channel access for reading the information in each column removed from the lattice, and for writing new information into these columns. A transposition structure is provided for transposing the information represented by bubble domains in each of the removed columns, in response to a signal from associated control circuitry. The write means is responsive to the transposition means when it is desired to transpose the bubble information in each of the removed adjacent columns. Circuitry for transposition can be magnetic bubble circuitry on the magnetic lattice chip, or external control circuits.

16 Claims, 8 Drawing Figures

TRANSPOSITION REORDERING

ADDRESS FORMAT

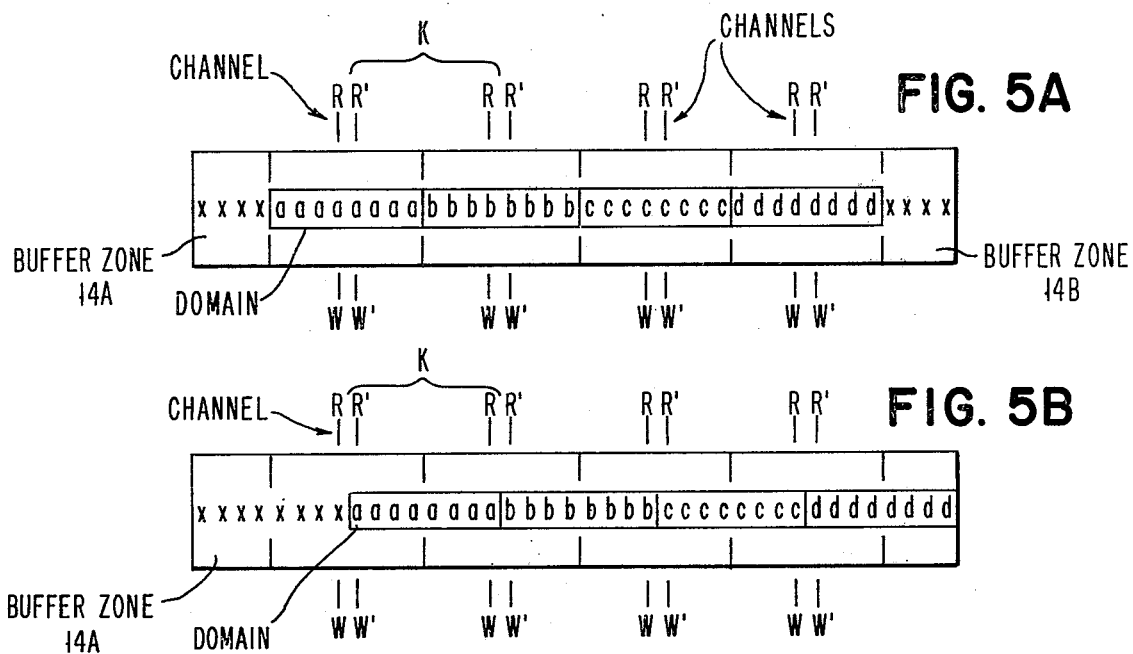
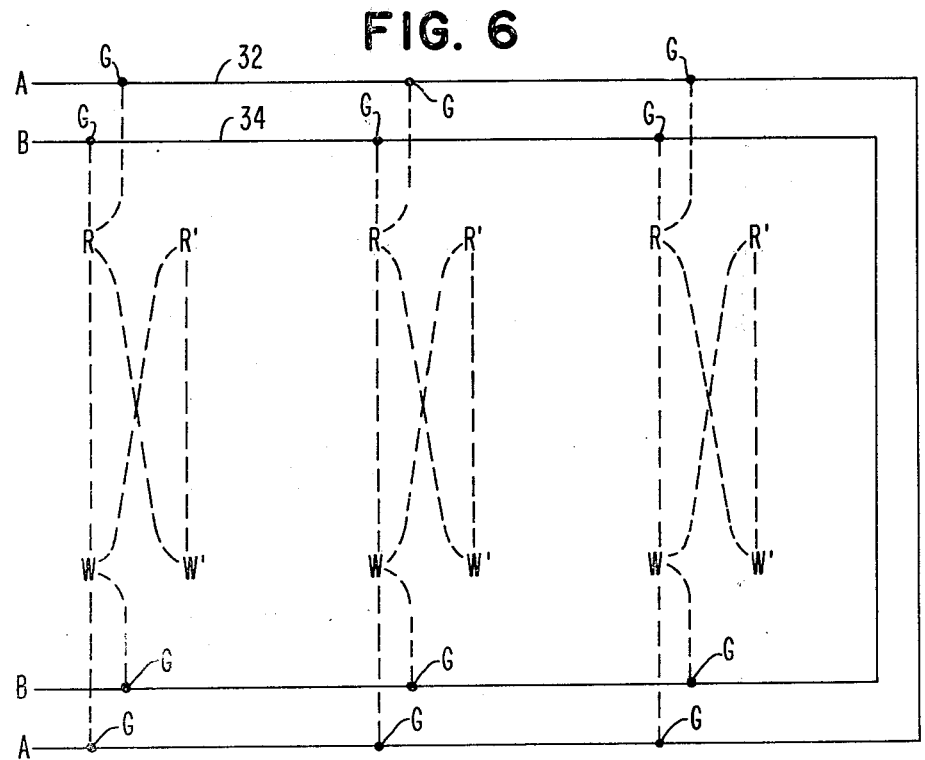

SELF-ORGANIZING MAGNETIC BUBBLE LATTICE FILE

BACKGROUND OF THE INVENTION

1. Field of the Invention

This invention relates to magnetic bubble lattice file storage, and in particular to structures and techniques for providing reordering capability in such storage in order to improve the access time to information in the bubble lattice file. In turn, this improves the usefulness of the bubble lattice file, especially where such a file is of extremely large capacity.

2. Description of the Prior Art

Various storage systems using magnetic bubble domains are well known. For example, a first form of bubble domain storage uses magnetic elements comprised of magnetic overlays or ion implanted regions for moving bubble domains in response to the reorientation of an in-plane magnetic field. These are the well known field access devices which can be comprised of, for example, T and I bar elements for moving magnetic bubble domains. In this type of field access storage, several techniques are known for improving the access time to bubble domains in the storage and for reordering the data in accordance with data management needs. For instance, dynamically ordered magnetic bubble storage is described in U.S. Pat. No. 3,670,313. In that technique, data in a shift register is reordered in order of last use to reduce the average access time to data in the register. In the least recently used algorithm, the closeness of the data to the access position is in accordance with whether or not it has been recently used. This is based on the thought that data which has been requested is more likely to be requested again more soon than data which has not been previously requested.

Other forms of dynamically ordered storage including those implementing the least recently used algorithm are described in U.S. Pat. Nos. 3,704,452, 3,766,534 (multiple bit resorting using multiple access positions), and U.S. Pat. No. 3,797,002 (pages stored in memory are divided in two groups with the pages of one group being accessed at one end of the shift registers while the pages of the other group are accessed at the other end of the shift registers). In addition, U.S. Pat. No. 3,701,132 describes data reordering in a major/minor loop bubble storage device.

A second type of magnetic bubble domain storage is the magnetic bubble lattice file in which the bubble domains are packed so close to one another that they interact with one another. This type of storage provides extremely high density in contrast with the type of storage previously described and offers the promise of very high capacity, very high density store. Bubble lattice file storage is described more particularly in U.S. Pat. No. 4,052,710. The bubble lattice file was also described by O. Voegeli et al in a paper entitled "The Use of Bubble Lattices for Information Storage", appearing in the Proceedings of the 20th Annual Conference on Magnetism and Magnetic Materials, Dec. 3-6, 1974, at San Francisco, Calif. At that conference, other papers on various aspects of the bubble lattice file were also presented.

In the bubble lattice file, domains are customarily used to represent information in accordance with their wall magnetization properties. This type of coding is generally described in U.S. Pat. No. 3,890,605. The lattice is initialized by any of a variety of techniques, such as that described in U.S. Pat. No. 3,953,842. Bubble domains in the lattice are translated back and forth to access channels where columns of bubble domains can be removed for reading of information and for writing new information into the lattice. A technique for translating the lattice domains is described in U.S. Pat. No. 3,930,244, while the column access technique for removing columns of bubble domains is described in copending application Ser. No. 429,601, filed Jan. 1, 1974, now U.S. Pat. 4,040,038. A bubble domain pump for moving magnetic bubble domains in the access channel is described in U.S. Pat. No. 3,913,079. A technique for stabilizing information states in the bubble lattice file using capping layers is described in U.S. Pat. No. 3,930,243.

It is apparent that considerable progress has been made in the development of bubble lattice files and that components exist for writing information into these files, reading information from these files, translating the lattice bubble domains, and removing selected columns of bubble domains from the lattice for I/O operations. However, the relative location of data in the bubble lattice file is fixed and no simple way has been proposed to implement in this type of file the type of dynamic ordering which has been described with respect to conventional field access bubble devices. If the bubble lattice file is to be used for storing large data bases, it is necessary to provide a technique for dynamic ordering in order to facilitate fast access in such a file. Further, such reordering is necessary to improve the average access time to information in the lattice file and to thereby increase the usefulness of such a large capacity storage system.

Accordingly, it is a primary object of the present invention to provide a simplified structure and technique for reordering data in a magnetic bubble lattice file.

It is another object of this invention to provide techniques and structure for improving the average access time to data in a magnetic bubble lattice file.

It is a further object of this invention to provide techniques for increasing the usefulness of magnetic bubble lattice files, and more particularly that type of file which is of extremely large capacity.

BRIEF SUMMARY OF THE INVENTION

This invention is directed to techniques for reordering data in a magnetic bubble lattice file in order to provide data management and improved access times to information in the file. The structure and technique for removing adjacent columns of bubble domains from the lattice and for transposing the information in these columns is presented. This transposition reordering is shown to provide improved average access times since information which is requested more frequently will be placed closer to the access position each time it is requested.

In contrast with conventional bubble lattice files, adjacent columns of bubble domains are removed from the lattice at the same time and then transposed with one another in accordance with the transposition algorithm. Structure is provided for removing double columns of magnetic bubble domains at the same time and for rewriting information into the lattice to effect the transposition of the removed columns. The structure for doing this can be implemented using well known bubble lattice components and all components used for reordering can either be on the magnetic chip used for the lattice or can be separate from the magnetic chip.

These and other objects, features, and advantages will be apparent from the following more particular description of the preferred embodiments.

BRIEF DESCRIPTION OF THE DRAWINGS

FIG. 3 is a drawing illustrating the address format used for transposition, while FIG. 4 is an example of the addressing scheme used for transposition.

FIG. 4B is an illustrative example of the lattice having two double access channels and sixteen columns of bubble domains.

FIGS. 5A and 5B schematically illustrate the movement of data in bubble columns to achieve in-file sorting.

FIG. 6 shows the use of a switching network employing a common bus to interconnect any two access channels of the lattice, in order to achieve fast in-file sorting in the lattice.

DETAILED DESCRIPTION OF THE PREFERRED EMBODIMENTS

Figure 1:
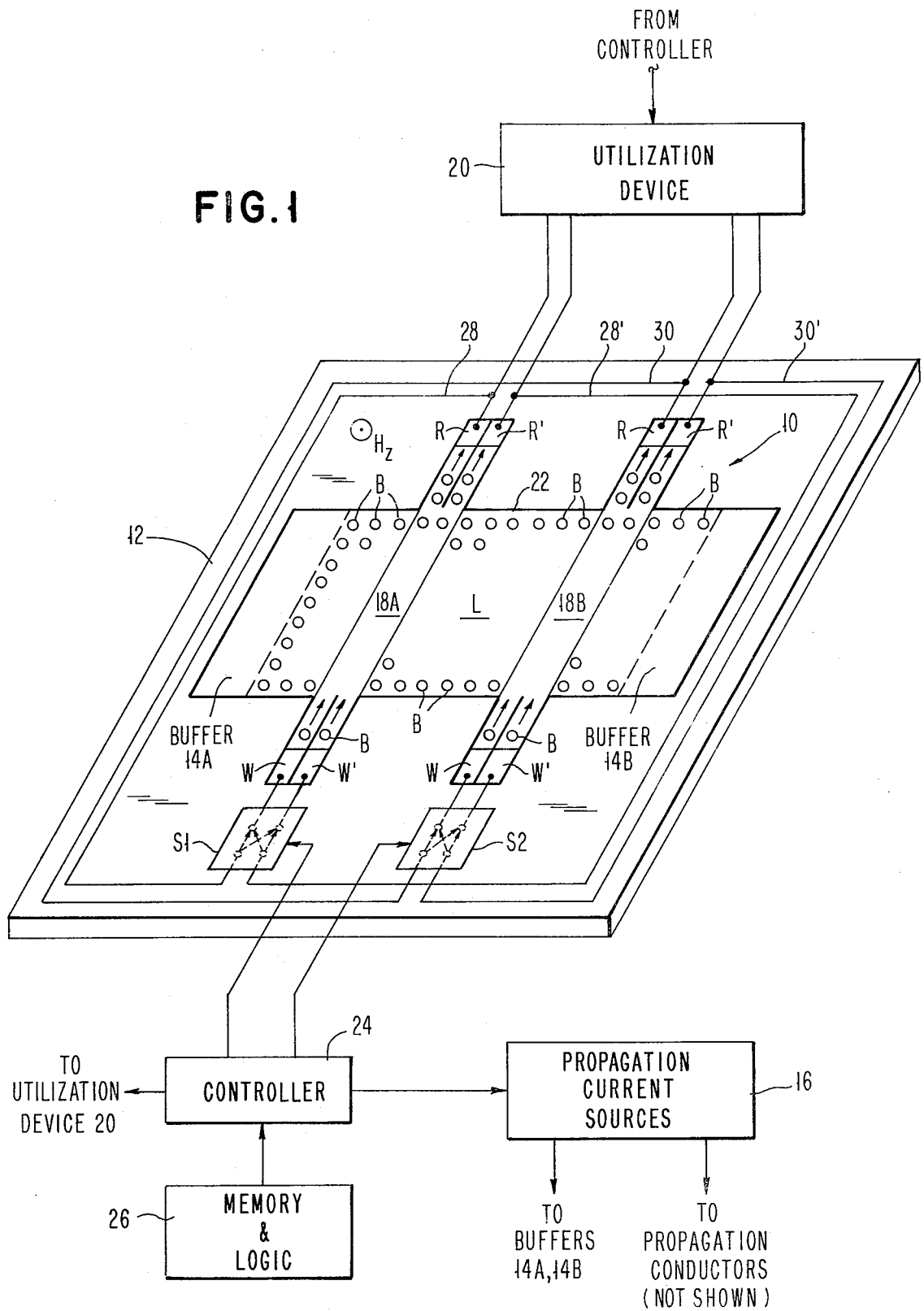
FIG. 1 is a diagram of a magnetic bubble lattice system in which data can be reordered.

In a bubble lattice file (BLF) bit information is generally encoded by the wall states of the magnetic bubble domains, rather than by the presence or absence of bubbles at certain locations. However, techniques are known in the art for utilizing the magnetic bubble domain lattice for locating bit positions and magnetostatically coupled domains coded in terms of presence/absence for representation of information. Such a memory is shown in, for instance, copending application Ser. No. 449,308 filed Mar. 8, 1974, now U.S. Pat. No. 3,996,571.

In a BLF, bubbles are accessed through a combination of two operations: (1) lattice translation and (2) column shifting. The lattice is generally comprised of an array of bubbles arranged with regular spacing, there being rows and columns of bubble domains filling every bit position in the lattice. The lattice can be translated as a whole, to the left or the right using translation means known in the art. When a desired column is placed in the access channel it is removed from the lattice in serial fashion, sensed, and then recreated at the other end of the column in order to maintain the integrity of the lattice. Thus, columnwise the bubbles operate as a shift register. However, shifting takes place only when the column is under one of the access channels. Several access channels on the BLF are separately controllable so that there is flexibility in choosing the data organization within the lattice. In one type of data organization, data can be stored serially in columns while in the other type of organization, data is stored in a set of all columns which can be accessed simultaneously by the access channel. This second scheme (interleaved organization) has a shorter read time if a whole block of contiguous data are to be accessed (for example, in sequential processing). On the other hand, the first scheme (interleaved organization) provides more parallel paths for queued requests. Furthermore, if data request lookahead is possible, one can take advantage of the separate control of individual columns under different access channels to line up data for future requests.

In the BLF, data can be retrieved in at least two ways. The first of these — termed retrieval by address — makes use of the stoppability of column shifting. Due to this, it is not necessary to store the address in conjunction with each column of data. Instead, a counter is used to keep track of the current address, i.e., the stopped position of each column. The amount of shifting required for an access is then readily obtained by a simple computation. Furthermore, the risk of overshifting is negligible.

In the second retrieval technique — termed retrieval by key (associative retrieval) — the exact address is not available (say, due to the cost of maintaining indices). Another reason may be that the address is available but the cost of address counters is not desirable. In this situation, either the key or the address is embedded into the data. Consequently, a comparator circuit is required for identifying the data to be retrieved.

Although data can be organized and retrieved from lattices by a variety of techniques as described above, the present technique will illustrate how data in the lattice can be reordered in accordance with desired goals. For instance, one may desire to decrease the average access time to data in the lattice by utilizing dynamic ordering. One type of dynamic ordering, referred to previously, is Last Use Ordering as is described in the referenced patents. In this type of ordering any data accessed is placed nearest the access position since it is assumed that that data will be frequently requested. Generally, bi-directionality of accessing is essential for implementing Last Use Ordering. However, Last Use Ordering is not feasible in a lattice without having read and write circuits on each end of the column access circuitry. Without this, Last Use Ordering is not feasible for reordering data within a column or for reordering columns among themselves.

In order to provide dynamic ordering in a lattice, Transposition Ordering is utilized herein. This technique approximates ordering by frequency of usage except that the data changes places with data in the position next to it so that data which is accessed moves only one data position at a time toward the access position. This will be explained in more detail later in the specification.

FIG. 1

To implement transposition ordering in a BLF, the BLF itself has to be modified in the manner shown in FIG. 1. First, each of the access channels consists of a shift register which can propagate two adjacent bubble domain columns at the same time. Propagation is accomplished by the same techniques used in a conventional BLF except that two columns instead of one are isolated from the rest of the lattice. Further, the access channel is terminated at one end by a pair of write stations and at the other by a pair of read stations. Structure is provided to transpose the information bits in each of the accessed columns with one another. Whether or not transposition occurs is determined by control circuitry.

In more detail, a magnetic bubble domain lattice device 10 is formed on a suitable magnetic material 12 in which the bubble domains B can be created, moved, read, and annihilated. Medium 12 can comprise any of the well known materials permitting bubble domain propagation, including garnets and amorphous magnetic materials.

The bubble lattice device 10 includes a regular lattice L of domains which in this example comprises several rows and columns of domains. At each end of the lattice are buffer regions 14A and 14B. These buffer regions comprise stripe domains and circuitry for adjusting the length of the stripe domains, as shown in more detail in U.S. Pat. No. 3,930,244. The buffer regions and the associated control circuitry for changing the length of stripe domains therein, together with propagation conductors (not shown), comprise the bubble lattice translation means used to translate the lattice back and forth between the buffer regions. Associated with the buffer control circuits and the propagation conductors are propagation current sources 16 which provide currents to the propagation conductors and to the buffer controls in order to move the lattice back and forth between the buffer regions. This type of operation and the associated structure are shown in great detail in aforementioned U.S. Pat. No. 3,930,244, and will not therefore be elaborated upon herein.

Two column accessing devices 18A and 18B are shown, each of which comprises two write means W and W', such as nucleating and encoding devices, and sensing or reading means R and R', such as magnetoresistive sensors. An example of a column accessing device suitable for use in this lattice is described in more detail in aforementioned U.S. Pat. No. 4,040,038 and assigned to the present assignee. Further, the type of bubble domain pump used to provide a columnar shift register for moving bubble domains in the access channels 18A and 18B is described in detail in U.S. Pat. No. 3.913,079, also assigned to the present assignee. Reference is made to aforementioned U.S. Pat. Nos. 4,040,038 and to 3.913,079 for a complete description of the column accessing mechanism.

For the purposes of the present description, it is sufficient to state that the column accessing devices 18A and 18B insert and remove bubble domains B from the lattice L in a direction substantially transverse to the direction of domain propagation defined by the lattice translation means. The domains B are translated in a horizontal direction in the plane of FIG. 1 into the column accessing devices 18A and 18B by the translation means including the propagation conductors (not shown) and the buffers 14A and 14B.

When two columns of lattice domains are located in either of the column accessing devices and are moved toward the read means R and R', an output signal will be produced which is sent to the utilization device 20. At the same time, new bubble domains having the same or different information state can be inserted into the same two columns of bubble domains by the write means W and W'. This will be explained in more detail later. Any one of the column accessing devices 18A and 18B can be actuated to sense two adjacent columns of bubble domains, or all of the accessing devices can be actuated at the same time to sense several sets of columns of bubbles.

The enclosure means 22 of the lattice L can be comprised of any of the well known means for controlling the positioning of bubble domains such as by providing a high energy boundary for the bubble domains. Structures to provide high energy boundaries can be fabricated from current carrying conductors and/or magnetic materials. Also, changes in the magnetic properties of the bubble domain material can be used. Such changes include thickness changes such as a sputter etched groove, and changes brought about by ion implantation, diffusion, etc. The enclosure means 22 surrounds the entire lattice L and is also located along the center of the column accessing devices 18A and 18B. Within the column accessing devices, the enclosure means functions as a guide rail for keeping separate the two adjacent columns of bubble domains accessed from the lattice by each of the column accessing devices.

In FIG. 1, the write means W and W' of each column access device are connected to switches S1 and S2. These switches have two modes: SET and RESET. In the RESET mode, the bubble domain sensed at R is regenerated at W while the bubble domain sensed at R' is regenerated at W'. Thus, when either of the switches S1 or S2 is operating in the RESET mode, the associated column access device operates in a manner similar to a conventional BLF, and no column transposition occurs. However, when any switch S is in SET mode, the roles of W and W' are reversed. When this occurs, a bit shifted out and read by R is regenerated by W', while a bit read by R' is regenerated by W. This transposes the adjacent columns since the individual bits of each column are regenerated in the adjacent column rather than in the column from which they originated. When the switch S is in the SET mode, two adjacent bubble columns of the lattice under the access channel are automatically transposed in the time taken to shift the full length of a column out of the lattice.

Switches S1 and S2 are conveniently electronic switches operating in the SET or RESET mode determined by commands from controller 24. Memory and logic circuitry 26, such as a CPU, provides information relative to the transposition algorithm to the controller 24 for control of the modes of the switches S1 and S2. A transposition is always made unless the requested information is already in the access column.

Switches S1 and S2 are conventional electronic switches, such as two input/two output binary switches or flip-flop circuits where electrical signals can be sent in either one of two paths depending upon whether the switch is in its SET or RESET mode. This type of circuitry is well known, as is the controller circuitry and memory and logic circuitry 26. For example, circuity which will provide transposition of bubble domain bits is shown, for instance, in aforementioned U.S. Pat. Nos. 3,670,313; 3,704,452; 3,766,534; and 3,797,002. All of these patents describe electronic circuitry for use in dynamic reordering of magnetic bubble domain bits in conventional field access devices.

In FIG. 1, conductors 28 and 28' lead from read circuits R and R' of column accessing device 18A to the switch S1, while conductors 30 and 30' lead from read circuits R and R' respectively of column accessing device 18B to switch S2. These conductors carry electrical signals from the various read devices R and R' to the associated switches for input to the write circuits W and W' of each column accessing device. Depending upon whether or not switches S1 and S2 are in the SET or RESET mode, the read circuits R and R' may be connected to either of the write circuits W and W'. For instance, if switch S1 is in the RESET mode, R will be connected to W and R' will be connected to W' so that information in the two columns accessed by column accessing device 18A will be returned to the same columns and no transposition will occur. However, if switch S1 is in its SET mode, then R will be connected to W' and R' will be connected to W. This will cause a transposition of information in the two columns removed by column accessing device 18A. Similar operations exist for column accessing device 18B depending upon whether switch S2 is in its SET or RESET mode.

The switches S1 and S2 can be magnetic bubble domain components which direct bubble domains to different paths in accordance with the controls provided to the switch. In this case, bubble domains removed from the read means are propagated around the lattice to the associated write means and then directed to the proper column in accessing devices 18A and 18B by bubble routing switches S1 and S2. For instance, a bubble domain sensed at R of accessing device 18A can be made to follow a shift register path from R to switch S1. Depending upon the state of the switch, the bubble domain would be returned to its original column or placed in the adjacent column. Although such components can be utilized, the operation of the read and write circuits under current controls using conductors 28, 28′, 30 and 30′ is a faster mechanism.

OPERATION OF THE SELF-ORGANIZED LATTICE

The lattice of FIG. 1 is capable of dynamic reordering in accordance with control signals applied thereto. In the following example, transposition ordering will be used to approximate ordering by frequency of usage. This type of reordering yields a shorter average access time to any information in the lattice as compared with static random ordering that is conventionally used.

The concept of transposition ordering is known in the art as can be seen by referring to an article by R. L. Rivest entitled "On Self-Organizing Sequential Search Heuristics", Comm. ACM, 19 (Feb. 2, 1976) pp. 63–67. Another reference which discusses sorting in memories is a text by D. Knuth, entitled Sorting and Searching (Section 6.1), published by Addison Wesley, Reading, Massachusetts, in 1973.

Figure 2:
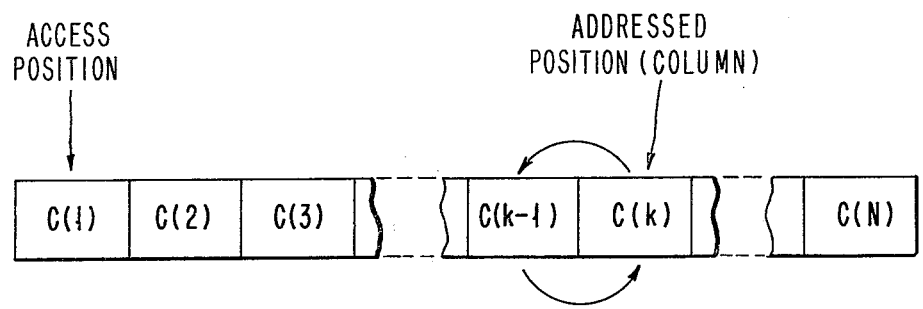
FIG. 2 represents transposition reordering in order to improve average access time to information in the lattice of FIG. 1.

Transposition reordering is illustrated in FIG. 2. Assume that there is a list of $n$ items in storage $C(1), C(2), \ldots C(n)$. The item located in the access position of the storage device is called $C(1)$, the next adjacent is $C(2)$, ... and so on. If these data items undergo transposition ordering, every time an access is made to a data item $C(k)$, it changes position in the storage device with $C(k1)$ unless $k=1$. That is, the accessed data item moves one position closer to the access position. As a result, the more frequently an item is accessed, the closer it is located to the access position. In this manner, the average access time will tend to be small.

ADDRESSING SCHEME

A binary notation is used for the address format since it is a flexible and natural notation to use, especially when digital control circuitry is used. In the present notation, the address of each column of information in the lattice consists of a sector address S and a displacement $d$. This is illustrated in FIG. 3.

The sector address S is given by the higher-order bits. A sector is defined as the set of bubble columns in a lattice which is accessible by an access channel using a left-shift or a right-shift. By convention, an even address is assigned to sectors on the right-hand side of any channel. That is, these are the columns on the right of the access channel which must be shifted to the left to get into the channel for removal from the lattice. The bubble domain columns in the sectors to the left of the channel have an odd sector address. Therefore, $S_o$, the lowest-order bit of S termed the left/right bit, will provide the translation direction control while the remainder of S (termed "channel identifier" in FIG. 3) identifies the channel.

The displacement $d$ represents in binary form the number of columns between the column being addressed and the column under the access channel. Thus, the column under the access channel has a displacement $d=0$.

Figure 3:
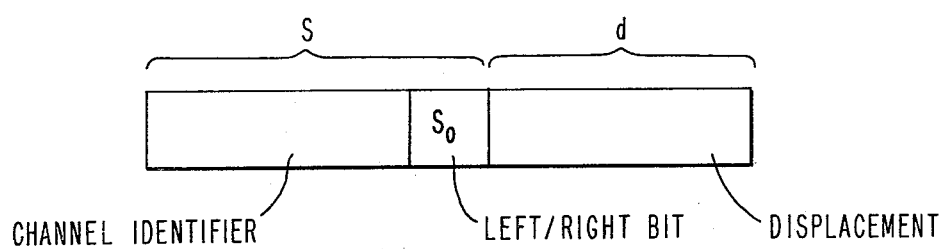
Figure 4A:
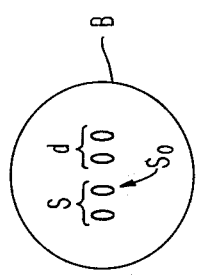
FIG. 4A is a schematic representation of a bubble domain and its address S.d.
Figure 4B:
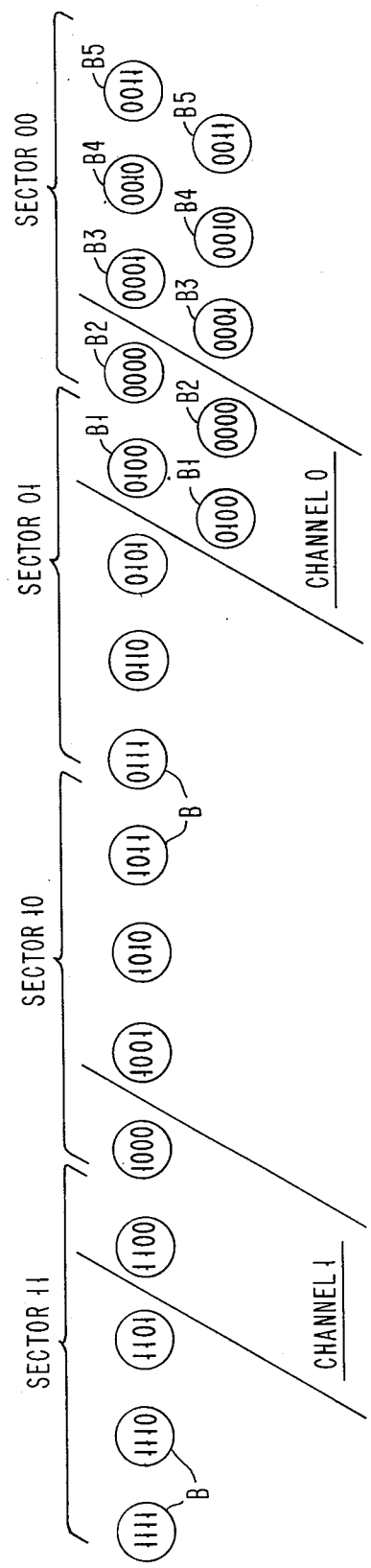
FIG. 4B shows a portion of a lattice addressing scheme using this notation. That is.

FIG. 3 shows the address format, while FIGS. 4A and 4B illustrate the use of this format in a lattice comprised of two double access channels and sixteen columns of bubble domains.

Referring to FIG. 4A, the representation of a bubble domain B in accordance with its sector address S and displacement $d$ is shown. The left-most two digits in the binary address of the bubble B are the sector address S while the right-most two digits are the displacement $d$. As indicated, the lowest order bit of S is $S_o$, which provides the lattice direction control.

This type of binary notation is used in the illustrative lattice of FIG. 4B, having two double access channels 1 an 0. For each access channel, there is an associated right-hand sector and an associated left-hand sector. In this example, three bubble domain columns are located to the right of each channel and three bubble domain columns are located to the left of each channel. For example, channel 0 has a right-hand sector 00 and a left-hand sector 01. For the right-hand sector, $S_o=0$, thus indicating that bubble domain columns in this sector will be translated to the left to the access channel 0. On the other hand, the three columns to the left of channel 0 are in sector 01. In this sector, the lowest order bit $S_o$ is 1. There are four sectors in this illustration, represented by the binary numbers 00, 01, 10, and 11, representative of sectors 1, 2, 3, and 4, respectively.

Referring to channel 0, since bubble domains B1 of sector 01 and B2 of sector 00 are already within the access channel, 0 their displacements $d$ are 00.

Bubble domains B3 in the first column to the right of channel 0 are in sector 00 and have sector addresses $S=00$. However, domains B3 have to be moved one column to the left to get into access channel 0 and therefore $d=01$ for these domains.

Domains B4 are two columns to the right of channel 0. Therefore, domains B4 have $d=10$ indicating that they must be shifted two columns to the left to get into access channel 0. Since they are still in sector 00, $S=00$ for these domains. In a corresponding manner, domains B5 in the right-most column of sector 00 have to be moved three columns to the left to get into access channel 0 and therefore, for these domains, $d=11$.

The binary addresses S·$d$ for the remaining domains B in the lattice can be represented as shown in FIG. 4B. It will be understood that, as the size of the lattice increases, the quantities S and $d$ may each be represented by more than just two digits.

ACCESS CONTROL

Every storage reference (request) is serviced in two phases: (1) translation and (2) input/output. In this explanation, a "request" is every time a data item is accessed whether it is to be read and returned, whether a new bit of information is to be placed in its position in the lattice, or a combination of read and write. The two phases for every storage reference are (1) translation and (2) input/output.

In the translation phase, domain columns are moved to the left or to the right into access channels in accordance with the following:

Translation = $d$ columns to the left, if $S_o = 0$
= $d$ columns to the right, if $S_o = 1$ The input/output phase of operation depends upon the mode of the switches S1 and S2. Also, for each column access device 18A and 18B, the particular read (R and R') and write (W and W') circuits used depend upon the value of $S_o$. The following table summarizes these operations.

Table 1

| d | $S_o$ | Output Operation | Switch Mode | Input Operation | Switch Mode |
|---|---|---|---|---|---|
| 0 | 0 | read out through R' | RESET | write in through W' | RESET |
|   | 1 | read out through R | RESET | write in through W | RESET |
| not zero | 0 | read out through R' while transposing | SET | write in through W' | RESET |
|   |   |   |   | transpose | SET |
|   | 1 | read out through R while transposing | SET | write in through W | RESET |
|   |   |   |   | transpose | SET |

As is evident, transposition occurs only when $d > 0$. If $d = 0$, the requested item is already in the access channel so no transposition is necessary. Further, if the request is only for reading information, then transposition can occur while the information is being read out. However, if it is desired to write in new information into a column, the write-in operation occurs first and then transposition occurs. This latter operation takes longer than merely a read/transpose operation.

At the end of the input/output phase, the bubble lattice translation is reversed so that the 0-displacement columns are returned to their channel positions. This last step may not be necessary. However, if it is eliminated, the translation in the translation phase will be given by either the difference or the sum of the new and old values of $d$, depending on whether the value of S alone has changed. It should be noted that the direction of shift would then also have to be changed accordingly.

In this accessing scheme, columns in the left sector of a channel do not mingle with those in the right sector. In each sector, transposition ordering is maintained. Also, if the column to be accessed is under the access channel (i.e. $d = 0$), then no transposition occurs. Thus, if a column is being accessed in consecutive requests, it will remain under the access channel and no translation of columns is needed.

On the other hand, the switches can be eliminated and the access channels connected such that they are permanently in the SET mode. If this is done, then whenever a column is accessed, a transposition between it and an adjacent column always occurs, even for a column where $d = 0$. Consequently, columns in the two sectors will mingle and the more frequently accessed columns will be clustered in the middle of the sector.

DIRECTORY MAINTENANCE

Since the address of each data column may change with time due to dynamic reordering, a directory is maintained in main memory to continually update these addresses. This directory is in the memory and logic circuit 26 shown in FIG. 1, and is a conventional type of look-up directory.

Directory Structure Showing the Ordering
DD—AA—CC—BB in Sector 01

| Table 2 | | Table 3 | |
|---|---|---|---|
| Data Name or Virtual Address | Canonical Address S·D | Canonical Address S·D | Real Address S·d |
| AA | 01.00 | 01.00 | 01.01 |
| BB | 01.01 | 01.01 | 01.11 |
| CC | 01.10 | 01.10 | 01.10 |
| DD | 01.11 | 01.11 | 01.00 |

Table 2 shows that in the directory, each data column has a name (or virtual address) which is mapped into a unique address S·D, where S is the sector number and D is the canonical displacement, i.e., displacement as if there is no reordering. Table 3 maps S·D into the real address S·d and is the only data structure that has to be updated. When an access is made to a bubble column with real displacement $k$ and $k$ is not zero, the corresponding entry in Table 3 must be changed to $(k-1)$. Furthermore, the entry with displacement $d = (k-1)$ must be located and changed to $k$. This last step requires a search of Table 3 since the table is sorted by S·D. The search, however, can be eliminated as described in the following paragraph.

To eliminate the search of Table 3, the self-organizing BLF stores D in the first few bits of each column at the time it is entered. This value is not affected by reordering and requires no maintenance. Every time an access is made, since the preceding column always passes through the dual read station, the canonical displacement of the column transposed can be passed back to main memory, thus obviating the need for a time-consuming search. The storage of D in the bubble column also furnishes a means for checking data validity. There are many space-saving methods for storing the S·D to S·d map. For example, it is sufficient to store only a list of all the $d$ values sorted in the order of S·D. Thus, given any value of S·D, the corresponding value of $d$ is found at exactly the $n$ th entry where $$n = 1 + D + S \times \text{no. of columns per sector.}$$

If not all the sectors are utilized, then it may be more efficient to have a separate list for each sector plus a small directory for sector lists. Such variations are well known to those skilled in the art of memory organization and information access.

BUBBLE DOMAIN CIRCUITRY

As noted, the switches S1 and S2 can be comprised of magnetic bubble domain components deposited on the magnetic chip which supports the lattice bubbles B. Further, the conductors 28, 28', 30, and 30' can be replaced by bubble domain shift registers in order to transport bubble domains from the read stations R and R' to the other end of the associated column accessing device. As an example, U.S. Pat. No. 3,913,079 shows the use of bubble pumps in combination with a bubble domain lattice for returning bubble domains read from the lattice back into the lattice.

Various bubble domain cross-over circuits for crossing over two streams of magnetic bubble domains are shown in U.S. Pat. No. 3,676,873; U.S. Pat. No. 3,866,191; and U.S. Pat. 3,543,255. In addition, reference is made to co-pending application Ser. No.

566,378, filed Mar. 7, 1975, now U.S. Pat. 4,040,018, and assigned to the present assignee, which shows a two input, two output switch which can selectively cross bubble domain streams or bypass these streams. This switch is also described in IBM Technical Disclosure Bulletin, Vol. 17, No. 12, May 1975, at page 3729. When that binary switch operates in its cross-over mode, it is equivalent to the operation of the switch S1 in its SET mode.

When the binary bubble domain switch of the aforementioned Technical Disclosure Bulletin is used in the embodiment of FIG. 1, the mode of that switch is determined by electrical signals from the controller 24, in accordance with known principles. Thus, the binary switches will either cross the input data streams or allow these streams to bypass one another when it is not desired to transpose information in the adjacent columns removed from the lattice.

Many variations on the Transposition Ordering described with respect to FIG. 1 can be foreseen by those of skill in the art. For example, instead of interchanging whole columns, one can interchange only portions of columns. This will be particularly suitable for a non-interleaved memory organization where data are stored serially in columns. On the other hand, columns can be interchanged at a fixed distance as opposed to interchanging adjacent columns as is shown in FIG. 1. If this is done, ordering by usage frequency can be approximated much more quickly by a compromise between Transposition Ordering (adjacent column interchange) and Last Use Ordering (interchange between a column addressed and a column in the access channel).

IN-FILE SORTING TECHNIQUE FOR BLF

Since it is widely recognized that many types of data processing operations require the manipulation of sequential files, the ease with which sorting can be done on large bubble lattices is an important consideration in choosing magnetic bubble devices as a storage technology. In-file sorting is sorting of data in the lattice where data records do not have to be transmitted back and forth between the BLF and the main memory. In-file sorting also has the advantage of not requiring extra storage space for storing temporary data-sets. The following will describe hardware features where support the fast sorting algorithm implemented in either software or microcode.

STRAIGHTFORWARD "IN-FILE" SORT

This is implemented using the BLF of FIG. 1. The bubble columns in the plane of medium 12 can be translated to the left or to the right en masse by the buffer zones on both sides of the lattice. The access channels have the capability of propagating a pair of adjacent columns so that bubbles are shifted through read stations R and R' at one end and then returned through write stations W and W' or W' and W respectively at the other end. In the latter case, the adjacent columns are automatically transposed in a single read operation.

Let K be the number of bubble columns between channels where K is an even number. Since access to a column may require a maximum translation of K/2−1 column positions, the buffer zone on either side must contain at least K/2−1 columns of empty space. Thus, each channel can access a total of K columns by a left or right translation; these K columns will be referred to as the nominal domain of the channel. If the space of one extra column is allowed, i.e., a total of K/2 columns in each buffer zone, then the bubble columns on the edge of the nominal domain in one access channel can be transposed with the neighboring columns in another channel as shown in FIGS. 5A, 5B. The transposition is facilitated by a crossover switch (RW, R'W')/(RW',R'W).

In the sequel, each bubble column will be referred to as a physical record (or simply record) and each record has a key (i.e., the record identifier). Generally, the size of the key is much smaller than the record itself. This makes it economically justifiable to maintain a directory of records sorted by key so that a sequence of physical locations is obtained for all the records in ascending (or descending) values of the key. By in-file sorting, it is meant the process of exchanging the locations of records so that records with consecutive key values will by physically contiguous. Sorting can be looked upon as the canonical form of arbitrary permutations in the sense that a permutation P becomes identical to sorting, if the keys are renamed, say $k1, k2, k3, \ldots$ etc., by $P(k1)$, $P(k2)$, $P(k3), \ldots$ etc.

Let the leftmost column in the lattice by location 1. If the record with the first key is in location $k$, then the lattice is translated so that this record is brought to the access channel and transposed with the one in location $k-1$. The procedure is repeated until the record has been transferred to its destination. If this is continued to transfer the record with the second key, the third, and so on, the whole file will eventually be sorted.

Since the lattice translation time for moving from one column to the next is small compared with the time to read a column, the performance of in-file sorting on bubble lattices is measured by the number of times a column is read, i.e., the number of transpositions. If there are N columns in the lattice, the maximum number of transpositions is NxN/2 while the average is NxN/4, if the records are random.

SWITCHING NETWORK FOR FAST "IN-FILE" SORT

Another aspect of the Dual Access BLF includes a switching network for inter-channel transposition. This network allows records to be moved directly from the domain of one access channel to another thus yielding significant savings in transposition time. FIG. 6 shows all the possible interconnections that the network supports between the read stations R, R' and the write stations W, W' of each channel (as per FIG. 1) and two exchange lines A and B.

In FIG. 6, two common buses 32 and 34 are used to interconnect (through gate circuits, represented as nodes G) the read and write circuits of any access channel with the read and write circuits of any other access channel. This allows transposition between any two channels in order to quickly sort and/or rearrange the data columns. Such sorting is done in sequence; for instance, transposition between a first set of channels occurs at a first instant of time, followed by transposition between another set of channels at a second instant of time, etc. While this arrangement allows transposition between any columns of the lattice, the transpositions must be time-sequenced (since a common bus is used) and therefore the simultaneous transpositions which can occur in the apparatus of FIG. 1 are not possible. However, the apparatus of FIG. 6 could be combined with that of FIG. 1 in order to achieve the advantages of both in a single BLF system.

What has been shown is a self-organizing bubble lattice file in which data rearrangement can take place. This increases the flexibility of bubble lattice storage and provides improved access times, particularly when the number of columns in the lattice is very large. Further, the improved access time results without requiring excessive numbers of column accessing channels.

Broadly, the invention includes a bubble lattice file and means for translating columns of bubbles in the file, together with associated means for transposing columns within the lattice. The columns which are transposed can be adjacent to one another or separate from one another, depending upon connections between the various read and write circuits in the lattice. If desired, the components for transposition can be provided directly on the magnetic chip or removed from it.

From the foregoing description, it will be readily apparent to those of skill in the art that various modifications can be made to the different components in this self-organizing lattice file in order to achieve data rearrangement. For instance, least recently used ordering can be achieved if read and write circuits are provided on each end of the column accessing devices, so that bi-directional shift register operation is achieved. Additionally, although two types of ordering - transposition ordering and in-file sorting - have been illustrated, other types of ordering will be readily apparent to those having skill in the art of memory organization and data accessing.

What is claimed is:

1. A magnetic bubble lattice file capable of rearranging bubble domains in said lattice of interacting domains, comprising:
   a lattice of interacting magnetic bubble domains arranged in rows and columns,
   translation means for translating said domains to access means,
   column access means for removing two of said bubble domain columns at the same time from said lattice, said access means including read means for reading information in said removed columns of bubble domains and write means for writing information into said lattice in place of said removed columns, there being a read means and a write means associated with each of said two columns,
   transposition means for interchanging the positions of said two removed columns of bubble domains when said two columns are reinserted into said lattice, said transposition means being connected between each of said read means and said write means for controllably connecting each of said read means to a selected one of said write means, in response to a control signal applied thereto, said transposition means including means for controlling the write means of each column access means by the output of the read means of the other column access means, and
   control means for applying said control signal to said transposition means.

2. The file of claim 1, further including additional access means for removing columns of bubble domains from said lattice, and said transposition means includes means for selectively interconnecting any two column access means for transposition of bubble domains in said two interconnected column access means.

3. The file of claim 1, where said access means includes means for removing two adjacent columns of bubble domains from said lattice at the same time.

4. The file of claim 1, where said transposition means is a two-input/two-output switch connected between two of said read means and two of said write means.

5. The file of claim 4, where said switch includes means for crossing two bubble domain streams and means for by-passing said two bubble domain streams in accordance with a control signal applied to said switch.

6. The file of claim 4, where said switch is an electronic switch having electrical conductors leading to it from said read means and electrical conductors going from it to said write means.

7. The file of claim 6, where said control means includes circuitry for applying electrical signals to said switch.

8. A magnetic bubble lattice file including a lattice of interacting coded magnetic bubble domains arranged in rows and columns, comprising:
   translation means for translating said columns to access means,
   first access means for removing a first column of bubble domains from said lattice,
   first read means for reading the information coded into said bubble domains in said first column,
   first write means for generating coded bubble domains for insertion into said first column,
   second access means for removing a second column of bubble domains from said lattice,
   second read means for reading the information coded into said bubble domains in said second column,
   second write means for generating coded bubble domains for insertion into said second column, and
   transposition means for connecting said first read means to said second write means and said second read means to said first write means in order to transpose the coded information represented by said bubble domains in said first and second columns.

9. The file of claim 8, where said first and second columns of bubble domains are adjacent to one another in said lattice.

10. The file of claim 8, where said access means removes said first and second column of bubble domains at the same time.

11. The file of claim 8, where said first and second access means use common circuitry to remove two adjacent columns of bubble domains at the same time.

12. A magnetic bubble lattice file including a lattice of interacting magnetic bubble domains arranged in rows and columns, comprising:
   first and second column access means extending across said lattice in the direction of said columns, each of said access means including means for removing a column of bubble domains from said lattice, wherein each of said access means includes an input end for putting bubble domains into the associated column of said lattice and an output end for removing bubble domains from the associated column of said lattice,
   translation means for translating desired columns of said lattice to said first and second column access means, and
   first means for interconnecting the input end of said first column access means and the output end of said second column access means for removing bubble domains from said second column and placing these or similar bubble domains in said first column, second means for interconnecting the input end of said second column access means and the output end of said first column access means for removing bubble domains from said first column and placing these or similar bubble domains in said second column, wherein said first and second means effect transposition of said first and second columns of bubbles.

13. The file of claim 12, where said first and second column are adjacent to one another in said lattice.

14. The file of claim 12, further including means for removing said first and second column from said lattice at the same time and means for transposing the bubble domains in said first and second column in the amount of time taken to remove a single column of bubble domains from said lattice.

15. The file of claim 12, where said first and second columns are separated from one another in said lattice by at least one other column of bubble domains.

16. The lattice file of claim 12, further including control means for controlling the interconnections between said first and second column accessing means, and means associated with said control means for determining the interconnections between said first and second access means in accordance with a program to reduce the average access time to any column of bubble domains in said lattice.

* * * * *